United States Patent
Jui-Yuan

(10) Patent No.: US 6,496,368 B2
(45) Date of Patent: Dec. 17, 2002

(54) HEAT-DISSIPATING ASSEMBLY HAVING HEAT SINK AND DUAL HOT-SWAPPED FANS

(75) Inventor: Hsu Jui-Yuan, Taoyuan (TW)

(73) Assignee: Delta Electronics, Inc., Taiwan (CN)

(*) Notice: Subject to any disclaimer, the term of this patent is extended or adjusted under 35 U.S.C. 154(b) by 0 days.

(21) Appl. No.: 09/855,081

(22) Filed: May 14, 2001

(65) Prior Publication Data
US 2002/0167798 A1 Nov. 14, 2002

(51) Int. Cl.⁷ ................................................ H05K 7/20
(52) U.S. Cl. ...................... 361/697; 165/80.3; 165/121; 415/213.1
(58) Field of Search ................................. 361/687, 690, 361/694, 695, 697, 704, 717–719; 165/80.3, 121–126; 174/16.1, 16.3; 454/184; 312/236; 257/722; 415/177, 178, 213.1, 214.1

(56) References Cited

U.S. PATENT DOCUMENTS

| | | | | |
|---|---|---|---|---|
| 6,181,556 B1 | * | 1/2001 | Allman |
| 6,226,178 B1 | * | 5/2001 | Broder |
| 6,259,600 B1 | * | 7/2001 | Talbot |
| 6,282,090 B1 | * | 8/2001 | Johnson |
| 6,141,211 A1 | * | 10/2001 | Strickler |
| 6,304,445 B1 | * | 10/2001 | Bollesen |

* cited by examiner

Primary Examiner—Gerald Tolin
(74) Attorney, Agent, or Firm—Alston & Bird LLP

(57) ABSTRACT

A heat-dissipating assembly for removing a portion of heat from a heat-generating device is provided. The heat-dissipating assembly includes a heat sink having a base in contact with a surface of the heat-generating device and a plurality of fins extending upwards from the base, and a first fan and a second fan respectively disposed on a first position and a second position of the heat sink, the first fan and the second fan being hot-swappable, wherein the portion of heat is conducted from the heat-generating device to the fins via the base, and further removed by a first action of the first fan and a second action of the second fan.

14 Claims, 4 Drawing Sheets

HEAT-DISSIPATING ASSEMBLY HAVING HEAT SINK AND DUAL HOT-SWAPPED FANS

FIELD OF THE INVENTION

The present invention relates to a heat-dissipating assembly, and ore particularly to a heat-dissipating assembly having a heat sink and dual hot-swapped fans.

BACKGROUND OF THE INVENTION

An integrated circuit chip is widely used in an electrical appliance such as a computer. When the electrical appliance operates, the chip generates energy in the form of heat. If the chip is unable to transfer enough heat to ambient air, the elevated operating temperature may result in damage of the chip or the breakdown of the whole appliance. In order to remove most heat generated from the chip, especially a CPU (central processing unit), an additional heat sink is usually attached on and spreads over the top surface thereof. The heat sink is made of a highly thermal conductive material and has a larger surface area than the attached CPU for improving heat transfer. In addition, the heat sink is frequently constructed with spaced fins in order to provide extra surface area. Furthermore, heat can quickly dissipate by improving the efficiency of the air circulation when a fan is disposed above/on the heat sink.

FIG. 1 is an exploded view showing a typical heat-dissipating assembly for a CPU 11. The heat-dissipating assembly includes a heat sink 12 made of a highly conductive material, for example aluminum, and a fan 13. The heat sink 12 includes a base 121 and a plurality of sheet-shaped fins 122. The base 121 is in contact with the top surface of the CPU chip 11. The fan 13 is engaged on the fins 122 by screws 16.

Although the heat-dissipating assembly can dissipate a lot of heat, it still has disadvantages as follows:

(1) The velocity of air flow introduced by the fan 13 is not uniformly distributed on each fin 122, for example the velocity under the hub 131 of the fan 13 is very low such that a portion of heat accumulates thereunder.

(2) If the fan 13 has a breakdown but is not replaced in a short time, the CPU chip 11 will be destroyed.

Therefore, the present invention provides an improved heat-dissipating assembly for overcoming the problems described above.

SUMMARY OF THE INVENTION

It is an object of the present invention to provide a heat-dissipating assembly having a heat sink and dual hot-swapped fans for enhancing efficacy and reliability of heat dissipation.

In accordance with an aspect of the present invention, there is provided a heat-dissipating assembly for removing a portion of heat from a heat-generating device. The heat-dissipating assembly includes a heat sink having a base in contact with a surface of the heat-generating device and a plurality of fins extending upwards from the base, and a first fan and a second fan respectively disposed on a first position and a second position of the heat sink, the first fan and the second fan being hot-swappable, wherein the portion of heat is conducted from the heat-generating device to the fins via the base, and further removed by a first action of the first fan and a second action of the second fan.

The heat-generating device is an electronic device in operation, and preferably a CPU (central processing unit).

Preferably, the first position and the second position are two selected from a first side surface, a second side surface and a top surface defined by the edges of the fins.

Preferably, the first action is one of attracting ambient air into the heat sink and exhausting hot air from the heat sink to environment.

Preferably, the second action is one of attracting ambient air into the heat sink and exhausting hot air from the heat sink to environment.

Preferably, the first fan is received within a first receptacle of a first frame coupled with the heat sink.

Preferably, the second fan is received within a second receptacle of a second frame coupled with the heat sink.

Preferably, each of the first frame and the second frame has hooks engaged with corresponding recesses of the heat sink.

In accordance with another aspect of the present invention, there is provided a heat-dissipating assembly for removing a portion of heat generated from a CPU (central processing unit). The heat-dissipating assembly includes a heat sink having a base in contact with a surface of the heat-generating device and a plurality of fins extending upwards from the base, and a first fan and a second fan respectively disposed on a first position and a second position of the heat sink, the first fan and the second fan being hot-swappable, the first position and the second position being two selected from a first side surface, a second side surface and a top surface defined by the edges of the fins, wherein the portion of heat is conducted from the heat-generating device to the fins via the base, and further removed by a first action of the first fan and a second action of the second fan.

Preferably, the first action is one of attracting ambient air into the heat sink and exhausting hot air from the heat sink to environment.

Preferably, the second action is one of attracting ambient air into the heat sink and exhausting hot air from the heat sink to environment.

Preferably, the first fan is received within a first receptacle of a first frame coupled with the heat sink.

Preferably, the second fan is received within a second receptacle of a second frame coupled with the heat sink.

Preferably, each of the first frame and the second frame has hooks engaged with corresponding recesses of the heat sink.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
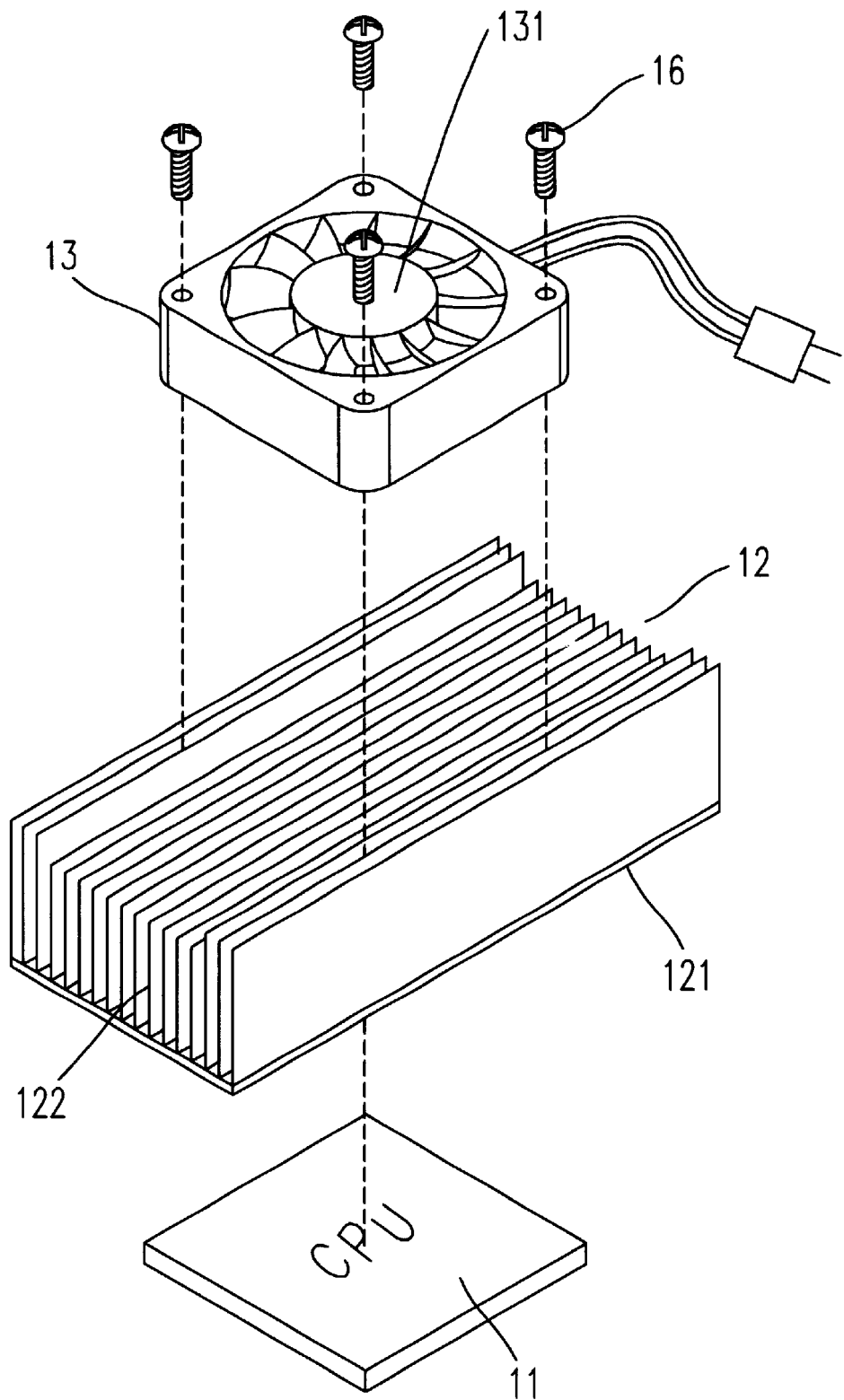
FIG. 1 is an exploded view showing a typical heat-dissipating assembly for a chip.
Figure 2:
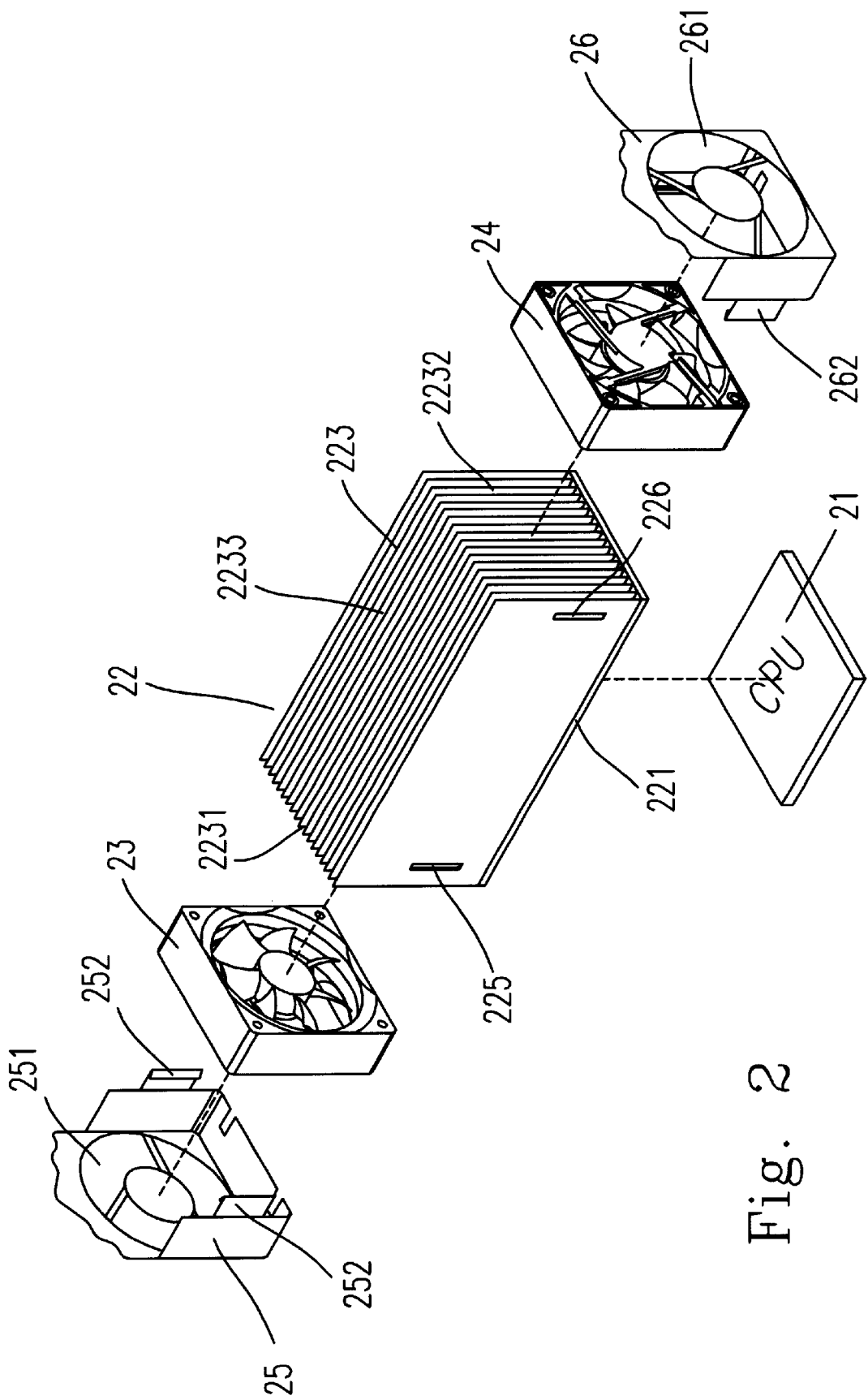
FIG. 2 is exploded view illustrating a heat-dissipating assembly according to a first preferred embodiment of the present invention.
Figure 3:
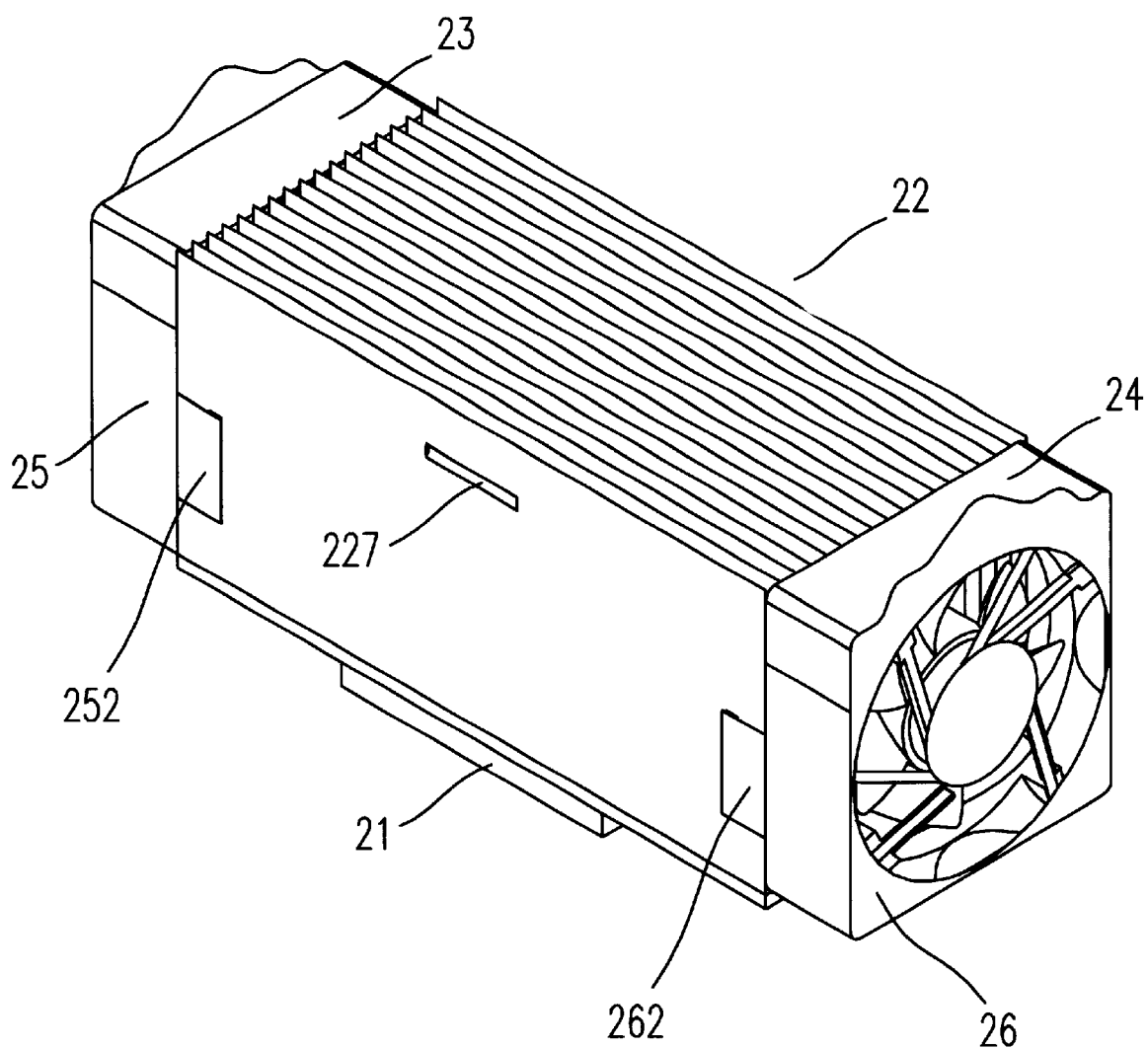
FIG. 3 is a perspective view of the a heat-dissipating assembly in FIG. 2.

FIGS. 2 and 3 are exploded and perspective view illustrating the heat-dissipating assembly according to the first preferred embodiment of the present invention, respectively. The heat-dissipating assembly principally includes a heat sink 22, two fans 23 and 24, and two frames 25 and 26.

The heat sink 22 is made of a highly conductive material, for example aluminum, and includes a base 221 in contact with a surface of a CPU 21 and a plurality of fins 223 extending upwards from the base 221. Since each of the fins 223 is plate-shaped, and thus a plurality of channels are formed between the fins 223. According to the present invention, the edges of the fins 223 are defined as a first side surface 2231, a second side surface 2232 and a top surface 2233. In this embodiment, the first fan 23 and the second fan 24 are respectively received within a first receptacle 251 of the first frame 25 and a second receptacle 261 of the second frame 26. Each of the first frame 25 and the second frame 26 has hooks 252, 262 engaged with corresponding recesses 225, 226 of the heat sink 22 such that the first fan 23 and the second fan 24 are respectively disposed on the first side surface 2231 and the second side surface 2232.

It is known that a portion of heat generated from the CPU 21 is conducted via the base 221 of the heat sink 22 and then removed by forced convection. Each of the fans 23 and 24 is optionally designed to attract ambient air into the heat sink 22 or exhaust hot air from the heat sink 22 to environment, for example the first fan 23 attracts ambient air and the second fan 24 exhausts hot air. Thus, the convection effect between the heat sink 22 and environment can be largely increased. It is of course that both fans 23 and 24 may attract ambient air or exhaust hot air. When both of the fans 23 and 24 attract ambient air into the heat sink 22, the hot air flows through the channels between fins 223 and is then exhausted from the top surface 2233 to environment. When both of the fans 23 and 24 exhaust hot air to environment, the ambient air is forced to be attracted through the top surface 2233 to the channels.

According to the present invention, the fans 23 and 24 are hot-swappable. When one of the two fans 23 and 24 is malfunctioned in operation, the other fan will operate at a higher speed so as to continuously remove most heat generated from the CPU 21. Thus, the user has a sufficient time to replace a new fan on-line. The principle of hot-swap is known to a person skilled in the art.

Figure 4:
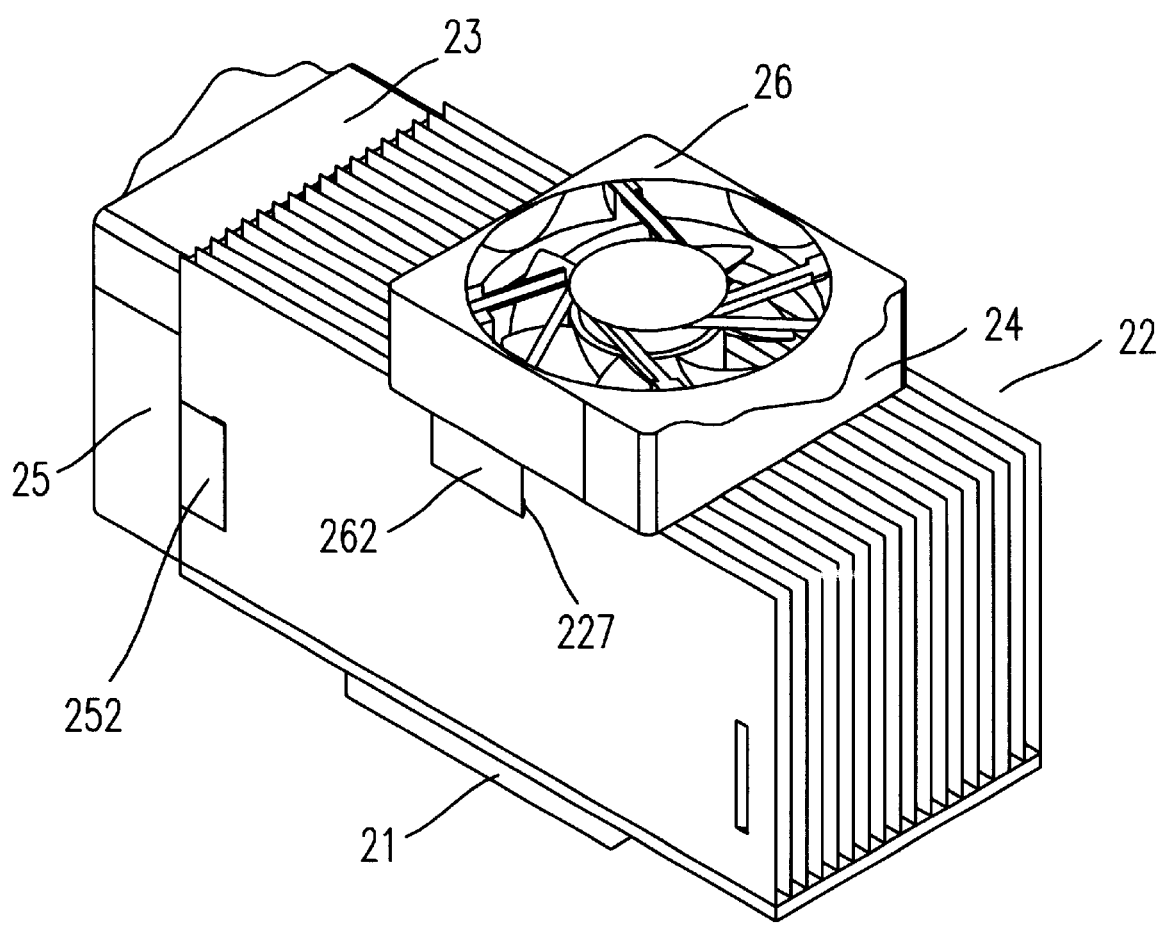
FIG. 4 is a perspective view illustrating a heat-dissipating assembly according to a second preferred embodiment of the present invention.

FIG. 4 is a perspective view of the heat-dissipating assembly according to the second preferred embodiment of the present invention. The structure and the operation principle are the same as those of FIG. 3, except that the second fan 24 is disposed on the top surface 2233 of the heat sink 22 and the hooks 262 of the frame 26 are engaged with recesses 227 of the heat sink 22.

As will be apparent from the above description, the heat-dissipating assembly according to the present invention has the following advantages:

(a) Since two fans are employed, the conducted heat under the hub of one fan can be effectively removed by the other fan so as to enhance heat dissipation.

(b) The heat-dissipating assembly of the present invention can provide reliable heat-dissipation because the other fan can still dissipate heat even though one fan has a breakdown.

(c) The fans 23 and 24 can be optionally disposed on two positions selected from the first side surface 2231, the second side surface 2232 and the top surface 2233 and designed to attract ambient air or exhaust hot air, which enhances the layout flexibility of the heat-dissipating assembly.

(d) Both of the two fans employed are hot-swappable such that when a fan has breakdown the user has a sufficient time to replace a new one on-line.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A heat-dissipating assembly for removing a portion of heat from a heat-generating device, comprising:
   a heat sink having a base in contact with a surface of said heat-generating device and a plurality of fins extending upwards from said base; and
   a first fan and a second fan respectively disposed on a first position and a second position of said heat sink, said first fan and said second fan being hot-swappable, said first position and said second position being two different positions selected from the group consisting of a first side surface, a second side surface and a top surface defined by the edges of said fins,
   wherein said portion of heat is conducted from said heat-generating device to said fins via said base, and further removed by a first action of said first fan and a second action of said second fan.

2. The heat-dissipating assembly according to claim 1, wherein said heat-generating device is an electronic device in operation.

3. The heat-dissipating assembly according to claim 2, wherein said electronic device is a CPU (central processing unit).

4. The heat-dissipating assembly according to claim 1, wherein said first action is one of attracting ambient air into said heat sink and exhausting hot air from said heat sink to environment.

5. The heat-dissipating assembly according to claim 1, wherein said second action is one of attracting ambient air into said heat sink and exhausting hot air from said heat sink to environment.

6. The heat-dissipating assembly according to claim 1, wherein said first fan is received within a first receptacle of a first frame coupled with said heat sink.

7. The heat-dissipating assembly according to claim 6, wherein said second fan is received within a second receptacle of a second frame coupled with said heat sink.

8. The heat-dissipating assembly according to claim 7, wherein each of said first frame and said second frame has hooks engaged with corresponding recesses of said heat sink.

9. A heat-dissipating assembly for removing a portion of heat generated from a CPU (central processing unit), comprising:
   a heat sink having a base in contact with a surface of said heat-generating device and a plurality of fins extending upwards from said base; and
   a first fan and a second fan respectively disposed on a first position and a second position of said heat sink, said first fan and said second fan being hot-swappable, said first position and said second position being two different positions selected from the group consisting of a first side surface, a second side surface and a top surface defined by the edges of said fins,
   wherein said portion of heat is conducted from said CPU to said fins via said base, and further removed by a first action of said first fan and a second action of said second fan.

10. The heat-dissipating assembly according to claim 9, wherein said first action is one of attracting ambient air into said heat sink and exhausting hot air from said heat sink to environment.

11. The heat-dissipating assembly according to claim 9, wherein said second action is one of attracting ambient air into said heat sink and exhausting hot air from said heat sink to environment.

12. The heat-dissipating assembly according to claim 9, wherein said first fan is received within a first receptacle of a first frame coupled with said heat sink.

13. The heat-dissipating assembly according to claim 12, wherein said second fan is received within a second receptacle of a second frame coupled with said heat sink.

14. The heat-dissipating assembly according to claim 13, wherein each of said first frame and said second frame has hooks engaged with corresponding recesses of said heat sink.

* * * * *